United States Patent
Schelling

(10) Patent No.: US 10,781,097 B2
(45) Date of Patent: Sep. 22, 2020

(54) MICROMECHANICAL COMPONENT

(71) Applicant: Robert Bosch GmbH, Stuttgart (DE)

(72) Inventor: Christoph Schelling, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/063,574

(22) PCT Filed: Jan. 11, 2017

(86) PCT No.: PCT/EP2017/050451
§ 371 (c)(1),
(2) Date: Jun. 18, 2018

(87) PCT Pub. No.: WO2017/121744
PCT Pub. Date: Jul. 20, 2017

(65) Prior Publication Data
US 2019/0002277 A1    Jan. 3, 2019

(30) Foreign Application Priority Data

Jan. 15, 2016 (DE) .................. 10 2016 200 489

(51) Int. Cl.
| | |
|---|---|
| *B81C 1/00* | (2006.01) |
| *B81B 7/00* | (2006.01) |
| *B81B 7/02* | (2006.01) |
| *H01L 23/00* | (2006.01) |

(52) U.S. Cl.
CPC ........ *B81C 1/00269* (2013.01); *B81B 7/0051* (2013.01); *B81B 7/02* (2013.01); *B81B 2201/0235* (2013.01); *B81C 2203/019* (2013.01); *B81C 2203/0109* (2013.01); *H01L 24/03* (2013.01); *H01L 2924/1461* (2013.01)

(58) Field of Classification Search
CPC ............. H01L 2924/1461; H01L 24/03; B81B 2201/0235; B81B 7/0051; B81B 1/00269; B81B 2203/0109; B81B 2203/019
See application file for complete search history.

(56) References Cited

U.S. PATENT DOCUMENTS

| | | |
|---|---|---|
| 7,041,225 B2 | 5/2006 | Lutz |
| 7,259,436 B2 | 8/2007 | Offenberg et al. |
| (Continued) | | |

FOREIGN PATENT DOCUMENTS

| | | |
|---|---|---|
| DE | 102007025880 A1 | 12/2008 |
| DE | 102012208031 A1 | 11/2013 |
| DE | 102014202801 A1 | 8/2015 |

OTHER PUBLICATIONS

International Search Report for PCT/EP2017/050451, dated Apr. 7, 2017.

*Primary Examiner* — Zandra V Smith
*Assistant Examiner* — John M Parker
(74) *Attorney, Agent, or Firm* — Norton Rose Fulbright US LLP; Gerard A. Messina

(57) ABSTRACT

A micromechanical component, having a carrier wafer having at least one micromechanical structure that is situated in a cavern; a thin-layer cap situated on the carrier wafer, by which the cavern is hermetically sealed; and a cap wafer situated on the thin-layer cap in the region of the cavern having the micromechanical structure, the cap wafer hermetically sealing a region of the thin-layer cap above the cavern.

9 Claims, 3 Drawing Sheets

(56) References Cited

U.S. PATENT DOCUMENTS

2004/0108588 A1\* 6/2004 Gilleo .................... H01L 23/10
257/704
2011/0006444 A1\* 1/2011 Schmitz ................. B81B 7/007
257/787
2013/0299928 A1\* 11/2013 Classen ................ B81B 3/0075
257/417

\* cited by examiner

MICROMECHANICAL COMPONENT

FIELD

The present invention relates to a micromechanical component and to a method for producing a micromechanical component.

BACKGROUND INFORMATION

Micromechanical sensors for measuring, for example, acceleration, rotational rate, magnetic field, and pressure are available and are produced in mass quantities for various automotive and consumer applications.

Conventional micromechanical sensors, such as inertial sensors, which require a vacuum encapsulation, require a hermetically tight capping. This can be realized either as a wafer cap or as a thin-film cap.

Wafer caps require a bonding process having, generally, metallic bond connections. These usually permit only low process temperatures, and as a result the internal pressures downward that can be enclosed are limited. Moreover, these bonded connections have turned out not to be adequately moisture-tight over the lifespan of the equipment.

Thin-layer caps are described, for example, in U.S. Pat. No. 7,041,225 B2 and U.S. Pat. No. 7,259,436 B2. The thin-layer cappings can take place at very high temperatures, and as a result particularly low internal pressures can be enclosed. However, the thin-film caps bend at atmospheric pressure, so that for mechanical support supporting columns have to be integrated, which prevents the use of small, space-saving sensors and can cause an errored signal when there are external pressure fluctuations.

SUMMARY

An object of the present invention is to provide an improved micromechanical component having a thin-layer cap.

According to a first aspect of the present invention, this object may be achieved by proving an example micromechanical component having:
  a carrier wafer having at least one micromechanical structure situated in a cavern;
  a thin-layer cap situated on the carrier wafer, by which the cavern is hermetically sealed; and
  a cap wafer situated on the thin-layer cap in the region of the cavern having the micromechanical structure, the cap wafer hermetically sealing a region of the thin-layer cap above the cavern.

According to a second aspect of the present invention, the object may be achieved by providing an example method for producing a micromechanical component, having the steps:
  providing a carrier wafer;
  forming a micromechanical structure in a cavern of the carrier wafer;
  situating a thin-layer cap on the carrier wafer, hermetically sealing the cavern; and
  situating a cap wafer on the thin-layer cap above the cavern having the micromechanical structure, the cap wafer hermetically sealing a region of the thin-layer cap above the cavern.

Via the cap wafer situated over the micromechanical structure, it can advantageously be achieved that a functional dependence on air pressure of the micromechanical component having the thin-layer capping is largely excluded. In particular, the pressing in of the thin-layer cap by air pressure can largely be avoided. In this way, an inertial sensor is created having a thin-layer cap that is largely insensitive to external air pressure fluctuations and mechanical stress. As a result, compact inertial sensors can advantageously be realized, because supporting structures for supporting the thin-layer cap are not required. Advantageously, the additional cap supports a reliable functioning of the inertial sensor under variable ambient environmental conditions.

Preferred specific embodiments of the micromechanical component are described herein.

A preferred specific embodiment of the micromechanical component in accordance with the present invention includes the cap wafer being a glass cap wafer. In this way, it is advantageously enabled that no additional electrical contacting element (e.g., wire bond) is required for the electrical contacting of the micromechanical structure of the micromechanical component. For example, in this way a chip scale package can be realized. For this purpose, for example an electrical via through the glass cap wafer can be formed, having solder balls on an upper side.

A further preferred specific embodiment of the micromechanical component in accordance with the present invention includes the cap wafer being an ASIC wafer. In this way, elements of the ASIC wafer can advantageously be used for the electrical contacting and for evaluation purposes for a sensor.

A further preferred specific embodiment of the micromechanical component in accordance with the present invention is distinguished in that a buried wiring level is formed in the carrier wafer underneath the micromechanical structure. In this way, an electrical contacting for the micromechanical structure can easily be provided.

A further preferred specific embodiment of the micromechanical component in accordance with the present invention is characterized in that two micromechanical structures are formed in the carrier wafer, a respective micromechanical structure being situated in a respective cavern, regions above the caverns being hermetically sealed by the cap wafer, and a fluid duct being formed between a cavern of the cap wafer and a cavern of the carrier wafer. The presence of two caverns is important in particular for inertial components; in this way, for example a rotational rate sensor and an acceleration sensor can be formed in a single housing. Through the two separate areas in the cap wafer, it is easily possible to provide different pressures for the two caverns.

A further preferred specific embodiment of the micromechanical component in accordance with the present invention is distinguished in that filled insulating trenches are formed in the thin-layer cap. In this way, regions separate from one another can advantageously be created to which different electrical potentials are supplied for controlling the micromechanical structure.

A further preferred specific embodiment of the micromechanical component in accordance with the present invention is characterized in that a metallic layer is formed on the thin-layer cap in the area of the filled insulating trenches. Via the metallic layer, it can be achieved that the filled insulating trenches are made gas-tight, and as a result the vacuum can be maintained in the cavern over the long term.

A further preferred specific embodiment of the micromechanical component in accordance with the present invention is distinguished in that the micromechanical component is an inertial sensor having at least one sensor element. In this way, the design of the additional cap is applied in a particularly useful fashion for inertial sensors.

A further preferred specific embodiment of the micromechanical component in accordance with the present invention is distinguished in that the inertial sensor has an acceleration sensor and a rotational rate sensor. Advantageously, the additional capping provided by the cap wafer, having two separate caverns, is possible for a provision of different pressures in two caverns, required for the named sensor topologies.

In the following, the present invention is described in detail, with further features and advantages, on the basis of the figures herein. All of the figures form the subject matter of the present invention, independent of their representation in the description. Identical or functionally identical elements have identical reference characters. The figures are in particular intended to illustrate the main principles of the present invention, and are not necessarily shown true to scale.

Disclosed device features result analogously from corresponding disclosed method features, and vice versa. This means in particular that features, technical advantages, and embodiments relating to the micromechanical component result analogously from corresponding embodiments, features, and advantages relating to the method for producing a micromechanical component, and vice versa.

DETAILED DESCRIPTION OF EXAMPLE EMBODIMENTS

Micromechanically-based inertial sensors are subject to a large number of demands that all have to be met as well as possible. Highly precise and energy-saving micromechanical rotational rate sensors can most advantageously be realized as so-called "high-quality oscillators" that represent systems having high resonance magnifications. To achieve the highest possible degree of quality, the micromechanical oscillator has to be enclosed in as good a vacuum as possible in order to minimize attenuation due to enclosed gas. In addition, the encapsulation has to be moisture-tight over the operating life of the equipment. Moreover, thermomechanical influences due to component packaging must be minimized, in order to exclude to the greatest possible extent any temperature drift of the sensor signal.

Also importantly, for combined inertial sensors (acceleration and rotational rate sensors), two different internal pressures have to be provided in the same component in adjacent caverns.

In order to achieve the greatest possible vacuum, the micromechanical structure is first sealed with a thin-film or thin-layer cap, for example in an epitaxial reactor at temperatures greater than 1000° C. At these high process temperatures in a hydrogen atmosphere, generally all of the surface-deposited molecules decompose and go into the gas phase. During cooling after the cavern sealing, there results a very low internal pressure, in accordance with Gay-Lussac's second law. The resulting thin-layer cap is in addition advantageously moisture-tight.

Due to its low thickness, typically less than approximately 50 μm, the thin-layer cap can however disadvantageously bend strongly as soon as the component is exposed to normal atmospheric pressure. Encapsulating the component with molding compound can cause further pressure loading. Conventionally, excessive deformation of the thin-film cap is avoided by building in supporting columns, which however requires additional surface area.

Therefore, in accordance with an example embodiment, to avoid supporting measures by placing an additional wafer cap on the thin-film cap, and producing a vacuum hollow space therein. In this way, the wafer cap shields the thin-layer cap against external pressure and mechanical stress influences. The bonding areas of the wafer cap are here formed in the same areas as the hollow space walls of the caverns situated thereunder.

The wafer cap can be realized either as a pure cap wafer or as an ASIC substrate, or ASIC wafer. The second capping provides the possibility of opening one of the thin-film-capped hollow spaces, and setting a higher internal pressure therein during the cap bonding process.

Figure 1:
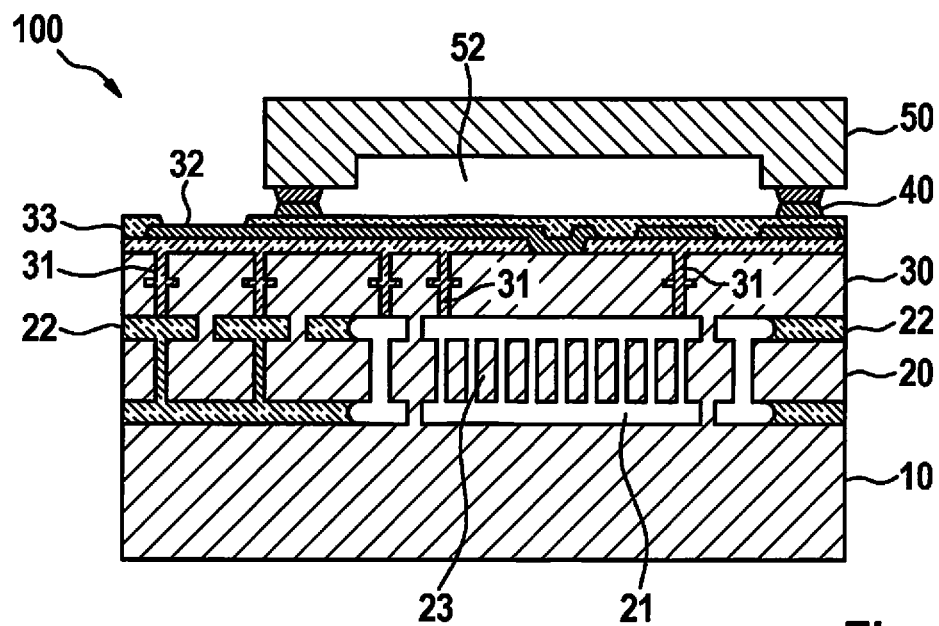
FIG. 1 shows a specific embodiment of a micromechanical component.

FIG. 1 shows a cross-sectional view through a first specific embodiment of a micromechanical component 100 in accordance with the present invention, in the form of an inertial sensor. Visible is a carrier wafer 10 on which there is formed a micromechanical functional layer 20 having a micromechanical structure 23 (MEMS structure). Micromechanical structure 23 is formed within a cavern 21 having a vacuum ("vacuum hollow space"), which is subject to various quality requirements depending on the type of sensor. Carrier wafer 10 with micromechanical structure 23 is capped with a thin-layer cap 30, for example made of polysilicon. Cavern 21 is hermetically sealed by thin-layer cap 30. Thin-layer cap 30 is preferably attached using the named high-temperature sealing process, thus providing a low internal pressure in cavern 21. Insulating trenches 31, filled with an insulating material, can be provided in thin-layer cap 30 in order to electrically separate areas regions of thin-layer cap 30 from one another in order in this way to make it possible to supply different electrical potentials to the various regions of thin-layer cap 30.

Above filled insulation trenches 31, there is partly situated a metallic layer 32 for the electrical contacting of the named areas of thin-layer cap 30. In the area above cavern 21 having micromechanical structure 23, a cap wafer 50 is attached by a bonded connection 40, so that in this way a hermetic seal of thin-layer cap 30 against the surrounding environment is realized. In this way, thin-layer cap 30 is protected from the effects of air pressure and/or mechanical stress in the area above cavern 21, so that thin-layer cap 30 cannot be pressed in above cavern 21. As a result, in this way micromechanical structure 23 formed in cavern 21 is better protected, and is therefore capable of functioning longer.

An insulating layer 33 is provided between bonding frame 40 and metallic layer 32 in order to prevent electrical short circuits between electrically conductive bonding frame 40 and metallic layer 32.

Metallic layer 32 acts as a wiring level for realizing electrical conductor paths for controlling or carrying away sensor signals of movable micromechanical structure 23 in functional layer 20 of carrier wafer 10. In addition, metallic layer 32 also acts as a gas-tight seal for insulating trenches 31, filled with insulating material, so that in this way the vacuum in cavern 20 can be maintained over a long period of time and with good quality.

Figure 2:
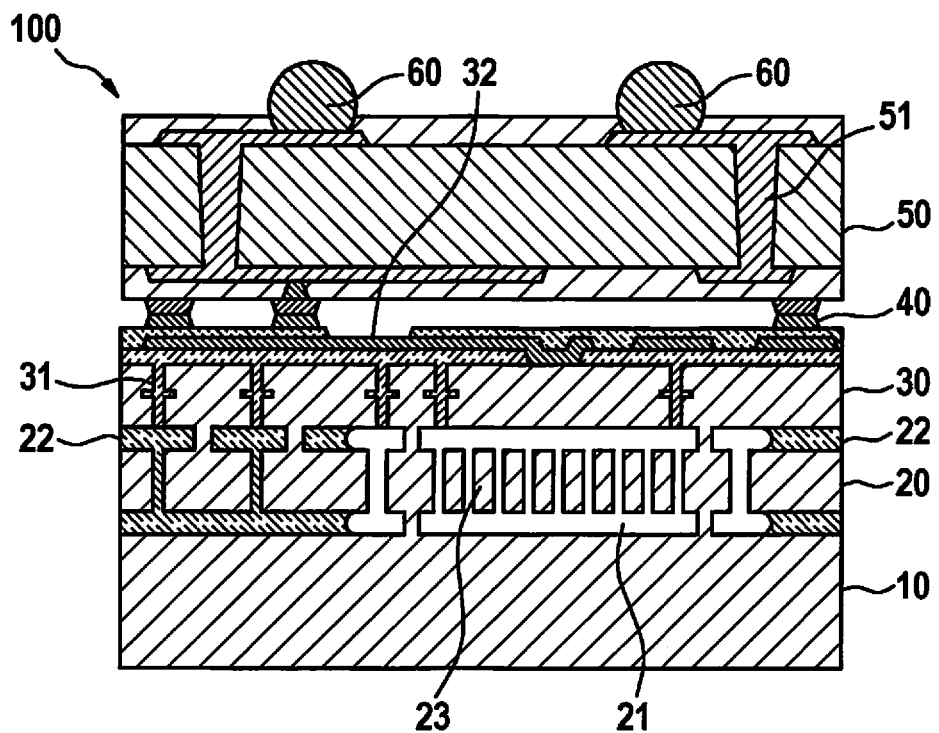
FIG. 2 shows a further specific embodiment of a micromechanical component.

FIG. 2 shows a cross-sectional view through another specific embodiment of micromechanical component 100. In this case, cap wafer 50 is formed as a glass cap wafer. Advantageously, through-glass-vias 51 are provided inside glass cap wafer 50, which in combination with solder balls 60 enable an electrical contacting of switching structures of micromechanical component 100. Advantageously, in this way no additional external wiring outlay is required compared to the topology of FIG. 1.

Figure 3:
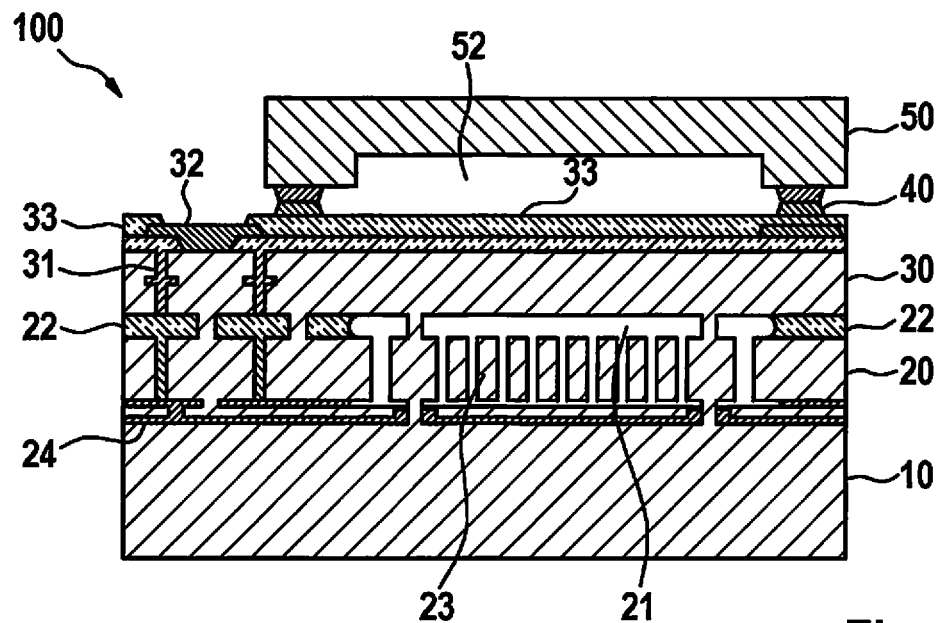
FIG. 3 shows a further specific embodiment of a micromechanical component.

FIG. 3 shows a cross-sectional view through a further specific embodiment of a proposed micromechanical component 100. In this variant, micromechanical component 100 contains a buried wiring level 24 underneath micromechanical functional layer 20. Via buried wiring level 24, an electrical supply to micromechanical structure 23 can be realized.

Figure 4:
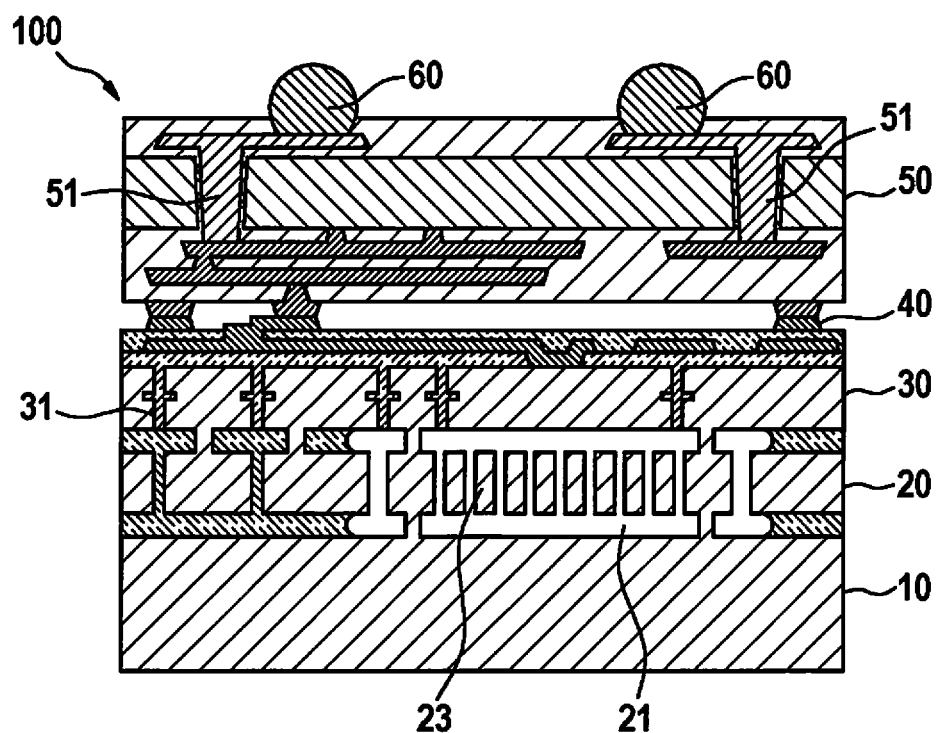
FIG. 4 shows a further specific embodiment of a micromechanical component.

FIG. 4 shows a cross-sectional view through a further specific embodiment of micromechanical component 100. In this case, cap wafer 50 is formed as an ASIC wafer, preferably a CMOS-ASIC wafer having electronic evaluation circuits, digital circuits, memories, interfaces, etc., in the transistor level (not shown). Carrier wafer 10 is connected to cap wafer 50, formed as an ASIC wafer, via a bonded connection 40. In this way, an evaluation or computing capacity can advantageously be integrated into micromechanical component 100, enabling a compact constructive design.

Advantageously, an external electrical contacting of the micromechanical component 100 takes place via through-silicon-vias (TSV) 51 in the ASIC wafer and solder balls 60 on the ASIC wafer.

Figure 5:
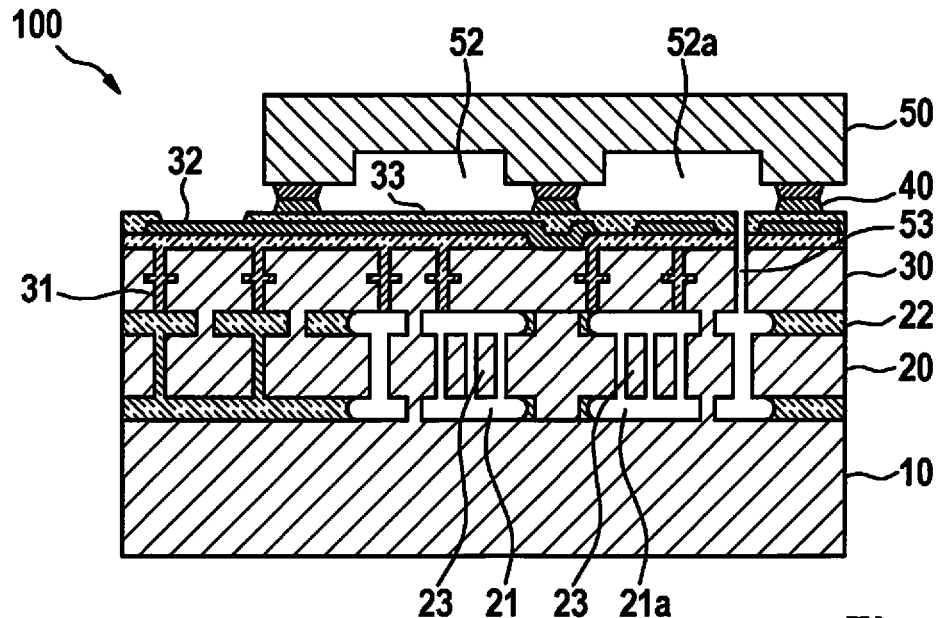
FIG. 5 shows a further specific embodiment of a micromechanical component.

FIG. 5 shows a cross-sectional view through a further preferred specific embodiment of micromechanical component 100. In this case, it is provided that two caverns 21, 21a are formed in functional layer 20, in each of which a micromechanical structure 23 is preferably formed. In this way, different sensor topologies can be realized with micromechanical structures 23. Here it is advantageously possible to enclose different pressures in the two caverns 21, 21a. This is realized by a cap wafer 50 that enables two caverns 52, 52a, separate from one another, above caverns 21, 21a.

In this way it is possible first to enclose a first pressure inside the two caverns 21, 21a of carrier wafer 10. Subsequently, through etching a fluid duct 53 is opened through thin-layer cap 30. Given a suitable second pressure, cap wafer 50 is then bonded onto thin-layer cap 30, thereby forming the second pressure via fluid duct 53 in second cavern 52a of cap wafer 50.

As a result, in this way it is advantageously possible to enclose different internal pressures in the two caverns 21, 21a, whereby an inertial sensor can be realized having two sensor topologies, for example in the form of an acceleration sensor and a rotational rate sensor. For the rotational rate sensor, in the described manner a very low first pressure can be provided in first cavern 21, and for the acceleration sensor, which requires a defined attenuation, a second pressure, larger by a defined amount, can be provided in second cavern 21a.

Figure 6:
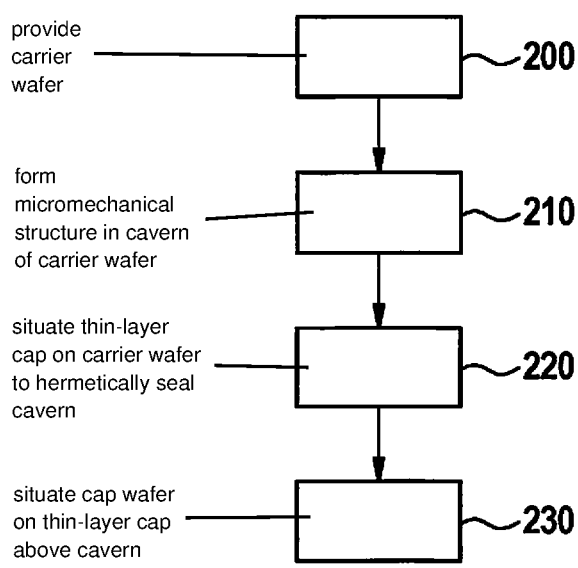
FIG. 6 shows a schematic sequence of a specific embodiment of the method according to the present invention for producing a micromechanical component.

FIG. 6 shows a schematic diagram of a specific embodiment of an example method in accordance with an example embodiment of the present invention for producing a micromechanical component.

In a step 200, a carrier wafer 10 is provided.

In a step 210, a micromechanical structure 23 is formed in a cavern 21 of carrier wafer 20.

In a step 220, a thin-layer cap 30 is situated on carrier wafer 10, hermetically sealing cavern 21.

In a step 230, a cap wafer 50 is situated on thin-layer cap 30 above cavern 21 having micromechanical structure 23, a region of thin-layer cap 30 above cavern 21 being hermetically sealed by cap wafer 50.

In sum, the present invention provides a micromechanical component, and a method for producing such a component, having a thin-layer cap without additional supporting elements, and thus being compact in size. Compared to conventional micromechanical components having thin-layer caps or wafer caps, in this way small constructive volumes can be realized.

Although the present invention has been described above on the basis of concrete examples of use, a person skilled in the art may also realize specific embodiments not described above, or only partly described above, without departing from the present invention.

What is claimed is:

1. A micromechanical component, comprising:
    a carrier wafer having at least two micromechanical structures that are situated in a cavern;
    a thin-layer cap situated on the carrier wafer by which the cavern is hermetically sealed; and
    a cap wafer situated on the thin-layer cap in a region of the cavern having the micromechanical structures, the cap wafer hermetically sealing a region of the thin-layer cap above the cavern.

2. The micromechanical component as recited in claim 1, wherein the cap wafer is a glass cap wafer.

3. The micromechanical component as recited in claim 1, wherein the cap wafer is an ASIC wafer.

4. The micromechanical component as recited in claim 1, wherein the carrier wafer has a buried wiring level in the carrier wafer underneath the micromechanical structure.

5. The micromechanical component as recited in claim 1, wherein filled insulating trenches are in the thin-layer cap.

6. The micromechanical component as recited in claim 5, wherein a metallic layer is on the thin-layer cap in a region of the filled insulating trenches.

7. The micromechanical component as recited in claim 1, wherein the micromechanical component is an inertial sensor having at least one sensor element.

8. The micromechanical component as recited in claim 7, wherein the inertial sensor has an acceleration sensor and a rotational rate sensor.

9. A micromechanical component comprising:
    a carrier wafer having at least one micromechanical structure that is situated in a cavern;
    a thin-layer cap situated on the carrier wafer by which the cavern is hermetically sealed; and
    a cap wafer situated on the thin-layer cap in a region of the cavern having the micromechanical structure, the cap wafer hermetically sealing a region of the thin-layer cap above the cavern,
    wherein two micromechanical structures are in the carrier wafer, a respective micromechanical structure being situated in a respective cavern, regions above the caverns being hermetically sealed by the cap wafer, a fluid duct being formed between a cavern of the cap wafer and the cavern of the carrier wafer.

* * * * *